(12) United States Patent
Yasuda

(10) Patent No.: US 6,967,503 B2
(45) Date of Patent: *Nov. 22, 2005

(54) COMPARATOR

(75) Inventor: Akira Yasuda, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/787,414

(22) Filed: Feb. 27, 2004

(65) Prior Publication Data

US 2004/0164777 A1  Aug. 26, 2004

Related U.S. Application Data

(62) Division of application No. 09/614,208, filed on Jul. 11, 2000, now Pat. No. 6,735,265.

(30) Foreign Application Priority Data

Jul. 12, 1999 (JP) ................................ P11-197609

(51) Int. Cl.[7] ............................................ G01R 25/00
(52) U.S. Cl. ........................................ 327/5; 327/160
(58) Field of Search ................................ 327/142, 147, 327/150, 151, 156, 159, 160, 2–12

(56) References Cited

U.S. PATENT DOCUMENTS

| 5,486,867 A | * | 1/1996 | Hsu et al. .................... 348/516 |
| 5,563,531 A | * | 10/1996 | Meyer ............................ 327/3 |
| 5,835,155 A | | 11/1998 | Jennes et al. ................ 348/536 |
| 6,169,717 B1 | | 1/2001 | Kim et al. .................. 369/59.1 |

FOREIGN PATENT DOCUMENTS

| JP | 59-58364 | 4/1984 |
| JP | 60-93967 | 6/1985 |
| JP | 63-46073 | 2/1988 |
| JP | 5-300014 | 11/1993 |

* cited by examiner

Primary Examiner—Timothy P. Callahan
Assistant Examiner—Cassandra Cox
(74) Attorney, Agent, or Firm—Oblon, Spivak, McClelland, Maier & Neustadt, PC

(57) ABSTRACT

A comparator compares a first binary input signal and a second binary input signal each binalized. A generator generates a reset signal at each rising edge or each falling edge of the first input signal. A counter counts the second input signal at each timing determined by the reset signal. The counted value represents a ratio of each frequency of the first input signal and the second input signal. A subtractor calculates a difference between the counted value and a set value representing a predetermined ratio of each frequency of the first input signal and the second input signal. An integrator integrates the difference. The integrated value represents a phase difference of the frequencies of the first input signal and the second input signal.

12 Claims, 11 Drawing Sheets

COMPARATOR

CROSS-REFERENCE TO RELATED APPLICATIONS

This application is based upon and claims the benefit of priority from the prior Japanese Patent Application No. P11-197609, filed Jul. 12, 1999, and from U.S. application Ser. No. 09/614,208, filed Jul. 11, 2000 now U.S. Pat. No. 6,735,265, the entire contents of which are incorporated herein by reference.

FIELD OF THE INVENTION

The present invention relates to a comparator for comparing the frequencies of two binary signals and outputting a phase difference of the two signals.

BACKGROUND OF THE INVENTION

As a phase comparator to compare the phases of two binary signals, a method using an exclusive-OR circuit is well known. In this case, when two binary signals are supplied to two input ports of the exclusive-OR circuit, a duty cycle (pulse width) in a binary output signal changes in proportion to a phase difference of the two input signals. Accordingly, the duty cycle is averaged by an integrator and an analog signal based on the phase difference is extracted.

The exclusive-OR circuit can detect the phase difference in case each frequency of two input signals are equal and a range of the phase difference is "–π~π". In short, the exclusive-OR circuit can not correctly detect the phase difference at operation of frequency step. Accordingly, if the exclusive-OR circuit is used as the phase comparator and an oscillation frequency of voltage control oscillator is controlled by the detected phase difference, i. e., if PLL (phase locked loop) circuit of this type is composed, a settling time (a time required for initial drop) becomes long.

On the other hand, the phase comparator whose range of phase difference is expanded as "–2π~2π" is known. This phase comparator operates so that output value of phase difference maintains "–2π" or "2π" in case the phase difference is over the range of "–2π–2π". Therefore, it is expected that this phase comparator correctly operates at operation of frequency step. However, even if the range of phase difference is expanded, the range is limited as "–2π–2π".

Furthermore, if PLL circuit is composed using above-mentioned phase comparator, it is necessary that the frequencies of the two input signals to the phase comparator are almost equal. As a result, a free degree of component of PLL circuit is greatly reduced. Furthermore, if a predetermined frequency is generated by a PLL circuit in which a divider is inserted in a loop, an output frequency is limited to integral times as much as frequency of reference signal.

In Japanese Patent Disclosure (Kokai) PH5-300014, a phase comparator applicable to the range of phase difference over "–2π~2π" is disclosed. However, in this phase comparator, a complicated analog circuit element, such as a reference signal generator of saw tooth signal or a differential phase generator of reference signal, is necessary. As a result, the circuit scale is very large and the cost greatly increases.

As mentioned-above, in the known phase comparator, a phase difference of two input signals whose frequencies are different is not detected. Especially, in case of composing a PLL circuit, it is necessary that frequencies of two input signals to the phase comparator are almost equal. As a result, the free degree of composition of PLL circuit becomes narrow, and a free degree of output frequency from PLL circuit is low.

Furthermore, in the phase comparator applicable to the case that the range of phase difference is over "–2π~2π" and frequencies of two input signals are different, the circuit scale becomes large and the cost becomes high.

SUMMARY OF THE INVENTION

It is an object of the present invention to provide a comparator able to detect a ratio of each frequency of two input signals whose frequencies are different, and to detect the phase difference of the two input signals whose frequencies are different using a simple digital circuit.

According to the present invention, there is provided a comparator for comparing a first binary input signal and a second binary input signal, comprising: a generator configured to generate a reset signal at each timing of a rising edge or a falling edge of the first input signal; and a counter configured to count the second input signal at each interval determined by the reset signal, the counted value represents a digital value representing a ratio of each frequency of the first input signal and the second input signal.

Further in accordance with the present invention, there is also provided a comparator for comparing a first binary input signal and a second binary input signal, comprising: a generator configured to generate a load signal at each rising edge or each falling edge of the input signal; and a counter configured to count the second input signal at each interval determined by the load signal, to calculate a difference between the counted value and a set value representing a predetermined ratio of each frequency of the first input signal and the second input signal, and to integrate the difference, the integrated value represents a phase difference of each frequency of the first input signal and the second input signal.

Further in accordance with the present invention, there is also provided a comparator for comparing a first binary input signal and a second binary input signal, comprising: a counter configured to count the second input signal at each timing of a rising edge or a falling edge of the first input signal; to calculate a difference between the counted value and a set value of integer part of predetermined ratio of each frequency of the first input signal and the second input signal, and to integrate the difference as a digital value; an integrator configured to integrate a set value of a decimal part of the predetermined ratio of each frequency of the first input signal and the second input signal; and a subtractor configured to calculate a difference between the digital value from said counter and the integrated value from said integrator, the difference represents a phase difference of each frequency of the first input signal and the second input signal.

Further in accordance with the present invention, there is also provided a comparator for comparing a first binary input signal and a second binary input signal, comprising: a counter configured to count the second input signal at each timing of a rising edge or a falling edge of the first input signal, and to output the counted value as a digital value representing a ratio of each frequency of the first input signal and the second input signal; a converter configured to convert a digital set value of non-integer digital set value as predetermined ratio of each frequency of the first input signal and the second input signal to a sequence of integer digital values whose average value coincides with the digital set value; and a subtractor configured to calculate a difference between the digital value output from said counter and integral digital values output from said converter.

Further in accordance with the present invention, there is also provided a comparator for comparing a first binary input signal and a second binary input signal, comprising: a converter configured to convert a digital set value of non-integer digital set value as predetermined ratio of each frequency of the first input signal and the second input signal to a sequence of integer digital values whose average value coincides with the digital set value; and a counter configured to count the second input signal at each timing of a rising edge or a falling edge of the first input signal, to calculate a difference between the counted value and the integral digital values, and to integrate the difference, the integrated value represents a phase difference of each frequency of the first input signal and the second input signal.

DETAILED DESCRIPTION OF THE PREFERRED EMBODIMENTS

Figure 1:
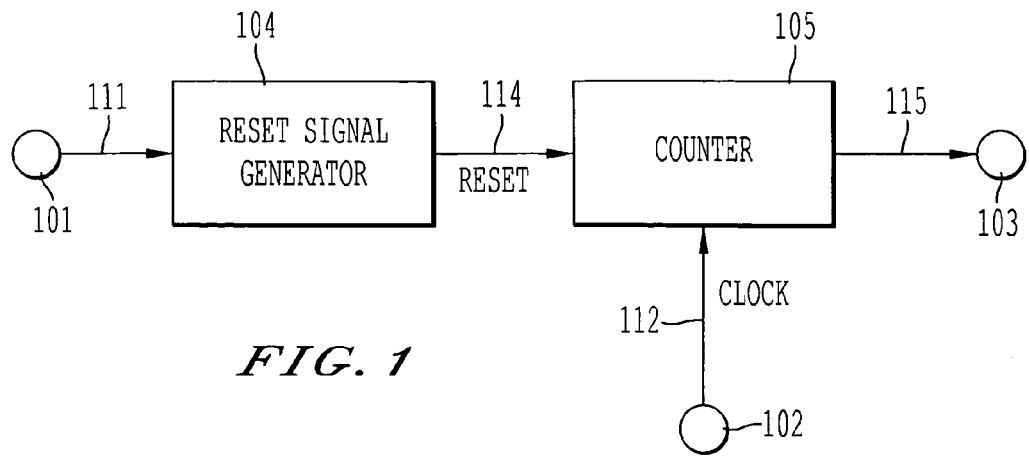
FIG. 1 is a block diagram of the comparator according to a first embodiment of the present invention.

Hereinafter, embodiments of the present invention will be explained by referring to the drawings. FIG. 1 is a block diagram of the comparator according to a first embodiment. This comparator inputs a binary first signal 111 from the first input terminal 101 and a binary second signal 112 from the second input terminal 102 and outputs a digital value 115 corresponding to a ratio of the frequencies of the first input signal 111 and the second input signal 112 to an output terminal 103. The comparator includes a reset signal generator 104 and a counter 105.

Figure 2A:
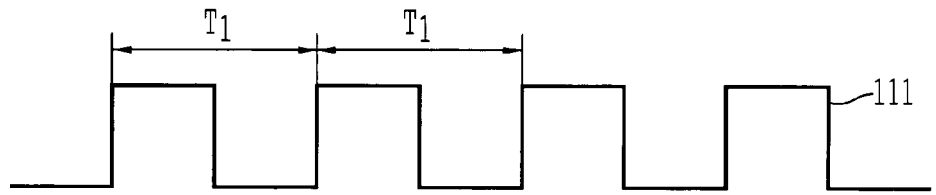
FIGS. 2A, 2B, 2C are schematic diagrams of signal waveform based on operation according to the first embodiment.
Figure 2B:
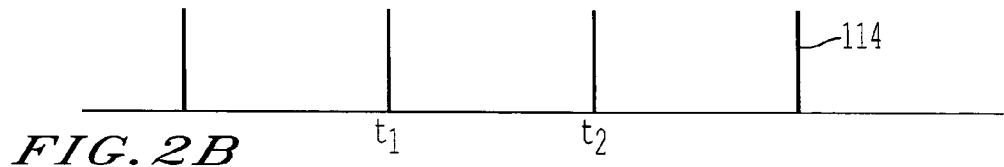
Figure 2C:
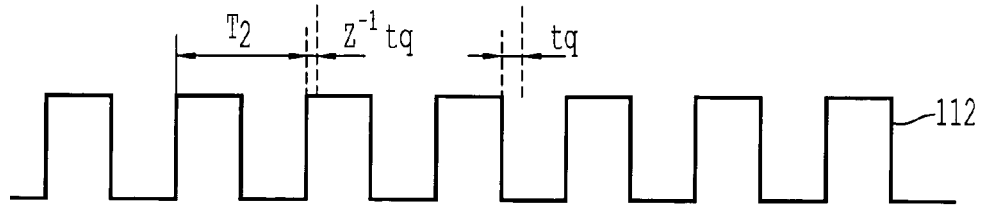

Next, FIGS. 2A, 2B, 2C are schematic diagrams of signal waves of the comparator according to the first embodiment. As shown in FIGS. 2A and 2C, the first input signal 111 and the second input signal 112 are binary signals. In this example, the frequencies of the input signals are different. The reset signal generator 104 consists of a differentiator. As shown in FIG. 2B, the reset signal generator 104 detects t1, t2, . . . , of the first input signal, and a pulse signal at the timing t1, t2, . . . , as a reset signal 114. The reset signal 114 is supplied to a reset input of the counter 105. On the other hand, the second input signal is supplied to a clock input of the counter 105. Accordingly, the counter 105 is reset whenever the reset signal 114 is input and counts the number of second input signals 112 until a next reset signal is input. The reset signal 114 is generated after each time period T1 of the first input signal 111. Accordingly, the digital value 115 output from the counter 105 represents a number of periods of the second input signal 112 in the period T1 of the first input signal 111, i. e., a ratio of frequency of the first input signal 111 and the second input signal 112. The digital value 115 is output from the output terminal 103 of the counter 105.

The comparator of the first embodiment is apparently similar to a frequency counter. However, the frequency counter counts a number of clocks input in a period of gate signal of predetermined time. On the contrary, in the comparator of the first embodiment, the first input signal 111 as the gate signal is a periodic signal repeatedly input, and the count of the second input signal 112 by the counter 105 is continually executed by unit of the period of the first input signal 111. This specific feature is different from the frequency counter. In a component of the first embodiment, if a ratio of frequency of the first input signal 111 and the second input signal 112 is an integer, the output digital value 115 correctly represents the ratio of frequency. However, in actual case, the ratio of frequency is often not an integer. In this case, the output digital value 115 includes an error. In the component of the first embodiment, this error is sufficiently reduced.

FIGS. 2A, 2B, 2C show the case that the ratio of frequency of the first input signal 111 and the second input signal 112 is not an integer. In FIG. 2C, "tq" is a rounding error generated by the counter 105. In case the counter 105 counts the number of the second input signal 112 in the period of the first input signal 111, the rounding error is generated because a time below one period of the second input signal 112 is not counted. "$z^{-1}$" represents one clock delay of z conversion in case the second input signal 112 is the clock input of the counter 105. Assume that a period of the second input signal 112 is T2. The output digital value 115 of the counter 105 is represented "$T1/T2+(1-z^{-1})tq$". In this output digital value 115, an error element is included as an item multiplied with "$(1-z^{-1})$". In this item, DC (direct current) element is determined as "0" by "z=1". Accordingly, the rounding error for the output digital value 115 does not affect on the DC element. In short, in a long time above predetermined length, i. e., from an average view in the long time, an effect of the rounding error of the counter 105 is not almost appeared in the output digital value 115, and the output digital value 115 correctly represents the ratio of frequency of the first input signal 111 and the second input signal 112. In other words, in one period of the first input signal 111, the output digital value 115 from the counter 105 includes the rounding error by the counter 105. However, this error element is transfered to a count value in the next period of the first input signal 111 by the counter 105. Then, this rounding error is propagated one by one by transfering it to each next period. From average view over a long time, the effect of the rounding error does not appear in the output digital value 115.

Figure 3:
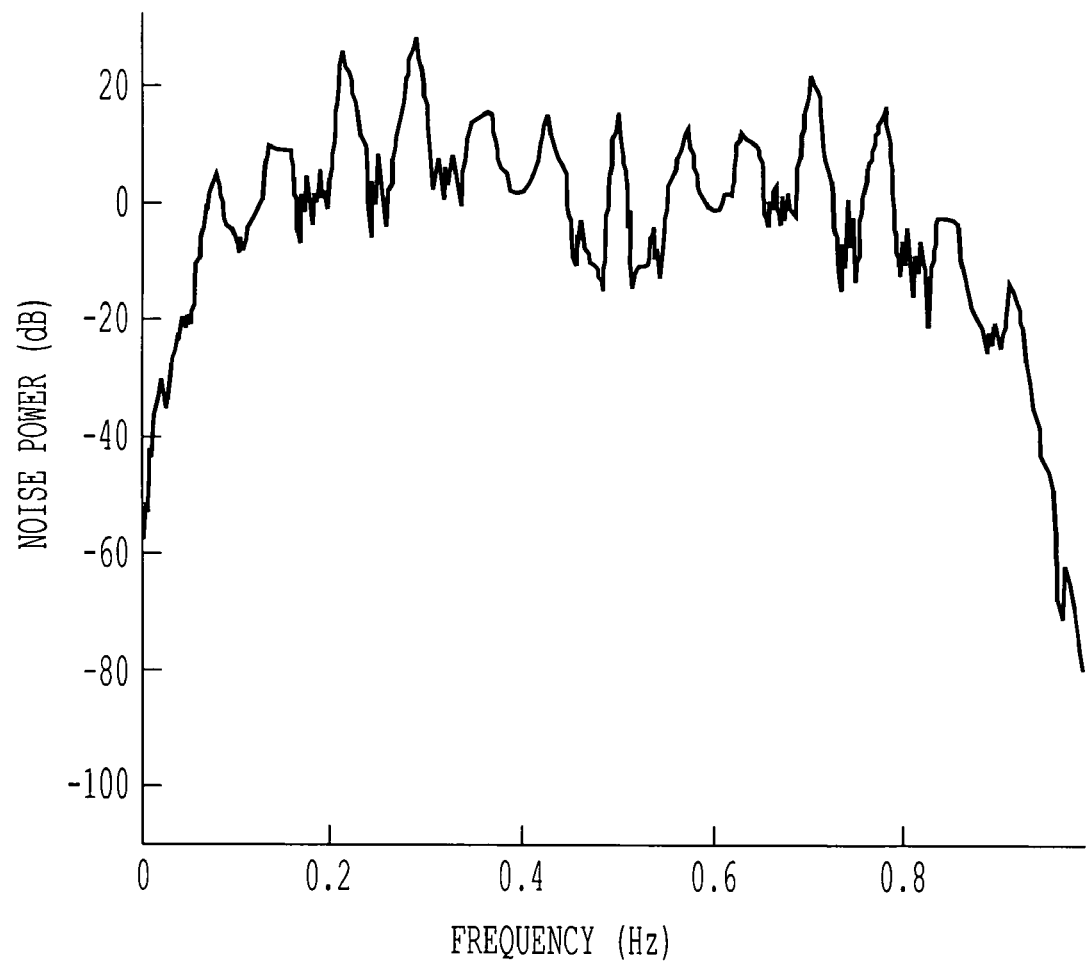
FIG. 3 is a schematic diagram of frequency spectral of error element in an output signal.

FIG. 3 shows a simulation result of a frequency spectrum of the error element in the output digital value 115. In FIG. 3, the horizontal axis represents the frequency and the vertical axis represents a noise power. Assume that a ratio of period (a reciprocal number of the ratio of frequency) of the first input signal 111 and the second input signal 112 is "T1/T2=10.5". In this case, the error is included in the output digital value 115 in one period of the first input signal 111 because the frequencies of the first input signal 111 and second input signal 112 are different. Normally, in case of the error generated at random, the spectrum is fixed irrespective of the frequency. However, as shown in FIG. 3, error element neighboring frequency "0", i. e., DC element of the error is very small because it is gradually reduced as above-mentioned principle.

As mentioned-above, in the comparator of the first embodiment, the ratio of frequency of the first input signal 111 and the second input signal 112 is calculated by high precision. Accordingly, as explained afterwards, if the frequencies of the input signals 111, 112 are different, a phase difference of both signals is correctly detected.

Figure 4:
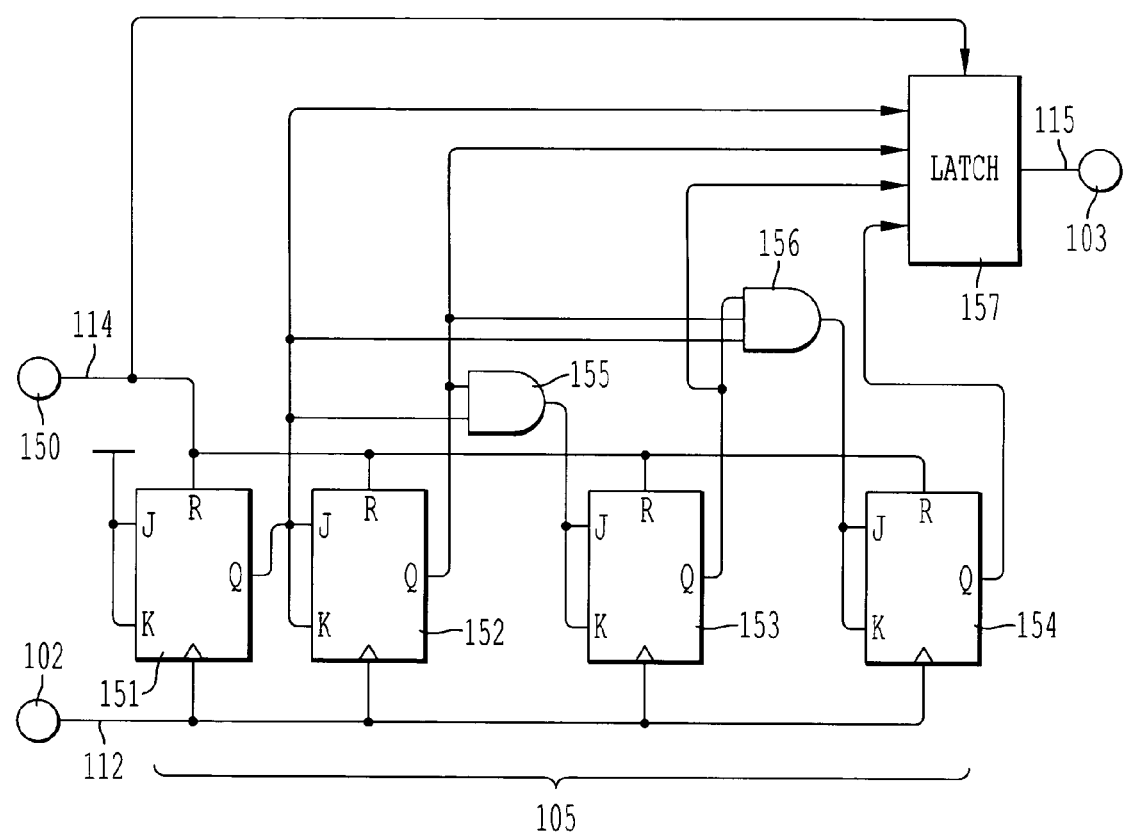
FIG. 4 is a circuit diagram of a counter in FIG. 1.

FIG. 4 shows a circuit diagram of the counter 105 according to the first embodiment. In this counter 105, a synchronous counter of four bits includes JK flip-flops 151, 152, 153, and 154 and AND gates 155 and 156. The reset signal 114 from the reset signal generator 104 is input to a reset terminal of JK flip-flops 151, 152, 153, and 154. The second input signal 112 is input to clock terminals of JK flip-flops 151, 152, 153, and 154. Outputs from the synchronous counters are latched by a four bit latch 157 at a timing of the reset signal 114. From output terminal of the latch 157, the number of periods of the second input signal 112 in a period of the first input signal 111 is obtained as the output digital value 115 by the counter 105. This count operation of the counter 105 is immediately reexecuted after reset of the reset signal 114. Therefore, if the ratio of frequencies of the first input signal 111 and the second input signal 112 is not an integer, DC value preserved in the latch 157 correctly represents the ratio of frequencies based on the above-mentioned principle as shown in FIG. 2.

In this way, in the comparator of the first embodiment, the ratio of the frequencies of the first input signal 111 and the second input signal 112 is calculated by high precision. In the first embodiment as shown in FIG. 2, the reset signal generator 104 generates the reset signal 114 at timing t1, t2, . . . , of a rising edge of the first input signal 111. However, the reset signal generator 104 may generate the reset signal at timing of a falling edge of the first input signal 111, or may generate the reset signal at both timings of a rising edge and a falling edge.

Furthermore, the reset signal generator 104 is not always necessary. If the counter 105 is reset by a rising edge or a falling edge of the first input signal 111, the reset signal generator 104 is omitted. This feature is also realized in the following embodiments.

Figure 5:
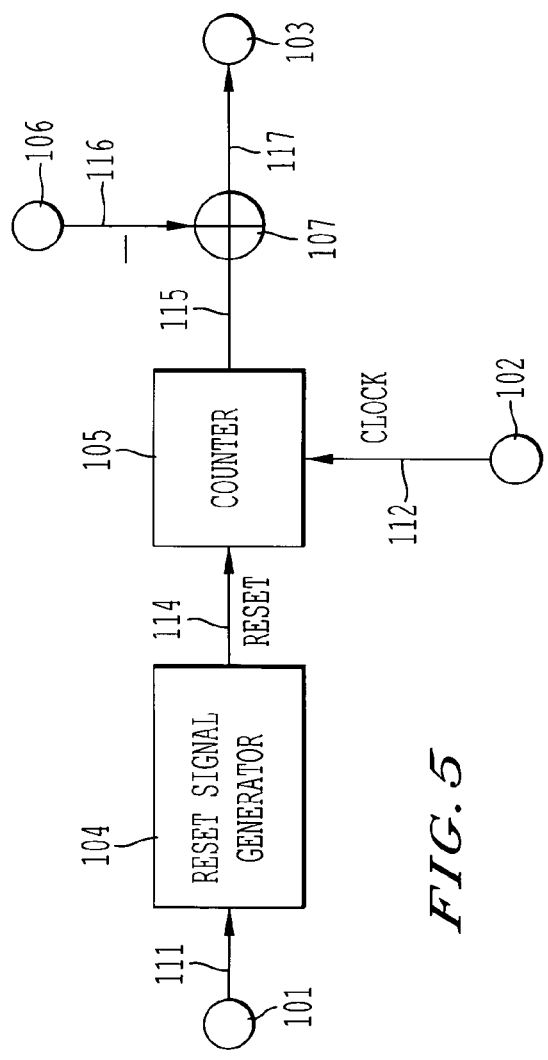
FIG. 5 is a block diagram of the comparator according to a second embodiment of the present invention.

FIG. 5 is a comparator according to a second embodiment of the present invention. In addion to the components of FIG. 1 in the first embodiment, a third input terminal 106 is added, and a subtractor 107 is inserted between the counter 105 and the output terminal 103. A set value of the ratio of frequency 116 is input to the third input terminal 106. The set value of the ratio of the frequencies 116 is a digital value set as the ratio of frequency of the first input signal 111 and the second input signal 112. The subtractor subtracts the set value of the ratio of frequency 116 from the output digital value 115 of the counter 105. Output digital value 117 from the subtractor 107 is guided to the output terminal 103. As a result, in the second embodiment, an error between the set value 116 and the ratio of the frequencies of the first input signal 112 and the second input signal 112 is calculated.

Figure 6:
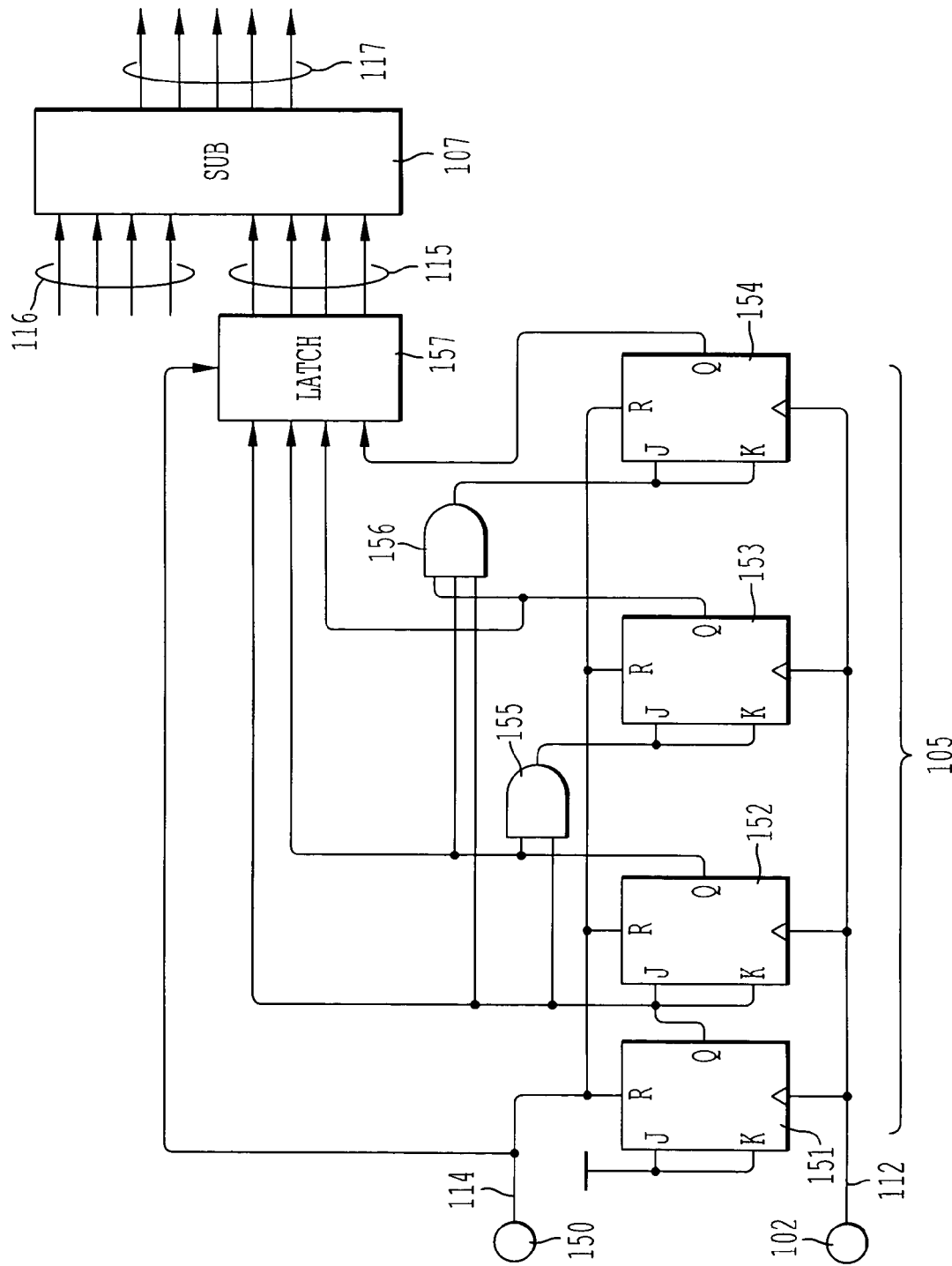
FIG. 6 is a circuit diagram of the counter and an adder in FIG. 5.

FIG. 6 is a circuit diagram of the counter 105 and the subtractor 107 in the second embodiment. In the same way as in FIG. 4, the counter 105 is a synchronous counter of four bits. An output digital value 115 from the four bits latch 157 set at end stage of the counter 105 is supplied to an add input of the subtractor 107. On the other hand, the set value of the ratio of frequency 116 consisted of four bits digital value is supplied to a subtraction input of the subtractor 107. The subtractor 107 subtracts the set value 116 from the output digital value 115. This subtraction result is output from the subtractor 107 as a digital value 117 of five bits.

As mentioned-above in FIG. 4, the latch 157 preserves a digital value of ratio of frequency of the first input signal 111 and the second input signal. Therefore, the set value 116 is subtracted from the output digital value 115 of the latch 157, and the output digital value 117 representing the error between the set value 116 and the digital value 115 is obtained. In this way, in the second embodiment, the error between the set value of the ratio of frequency 116 and the actual ratio of the frequencies of the first input signal 111 and the second input signal 112 is calculated with high precision.

Figure 7:
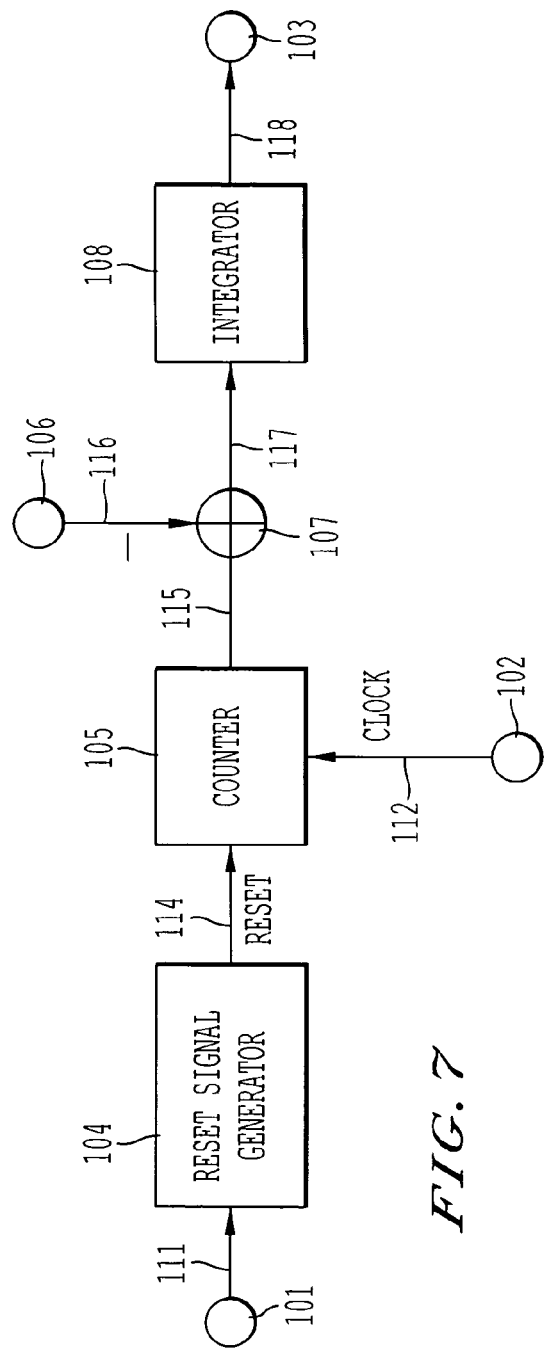
FIG. 7 is a block diagram of the comparator according to a third embodiment of the present invention.

FIG. 7 is a block diagram of the comparator according to a third embodiment of the present invention. In the comparator of FIG. 7, an integrator 108 is added as a post stage of the subtractor 107 in FIG. 5. As mentioned-above in the second embodiment, the error between the set value 116 and the ratio of frequency of the first input signal 111 and the second input signal 112 is output from the subtractor 107. The integrator 108 integrates the error. As a result, a phase difference between the first input signal Ill and the second input signal 112 in frequency based on the set value 116 is calculated.

In order to explain in detail, assume that the frequency of the first input signal is f1, the frequency of the second input signal is f2, and the set value 116 is m. In this case, the integrator 108 outputs a digital value 118 representing a phase difference between the frequency f1 of the first input signal 111 of m times ("m×f1" signal) and the frequency f2 of the second input signal 112. In this case, "m" is not limited to an integer and may be a decimal. Accordingly, in the third embodiment, even if the ratio "f1/f2" of frequency of the first input signal 111 and the second input signal 112 is any value, a phase comparison between both input signals 111, 112 is executed.

Figure 8:
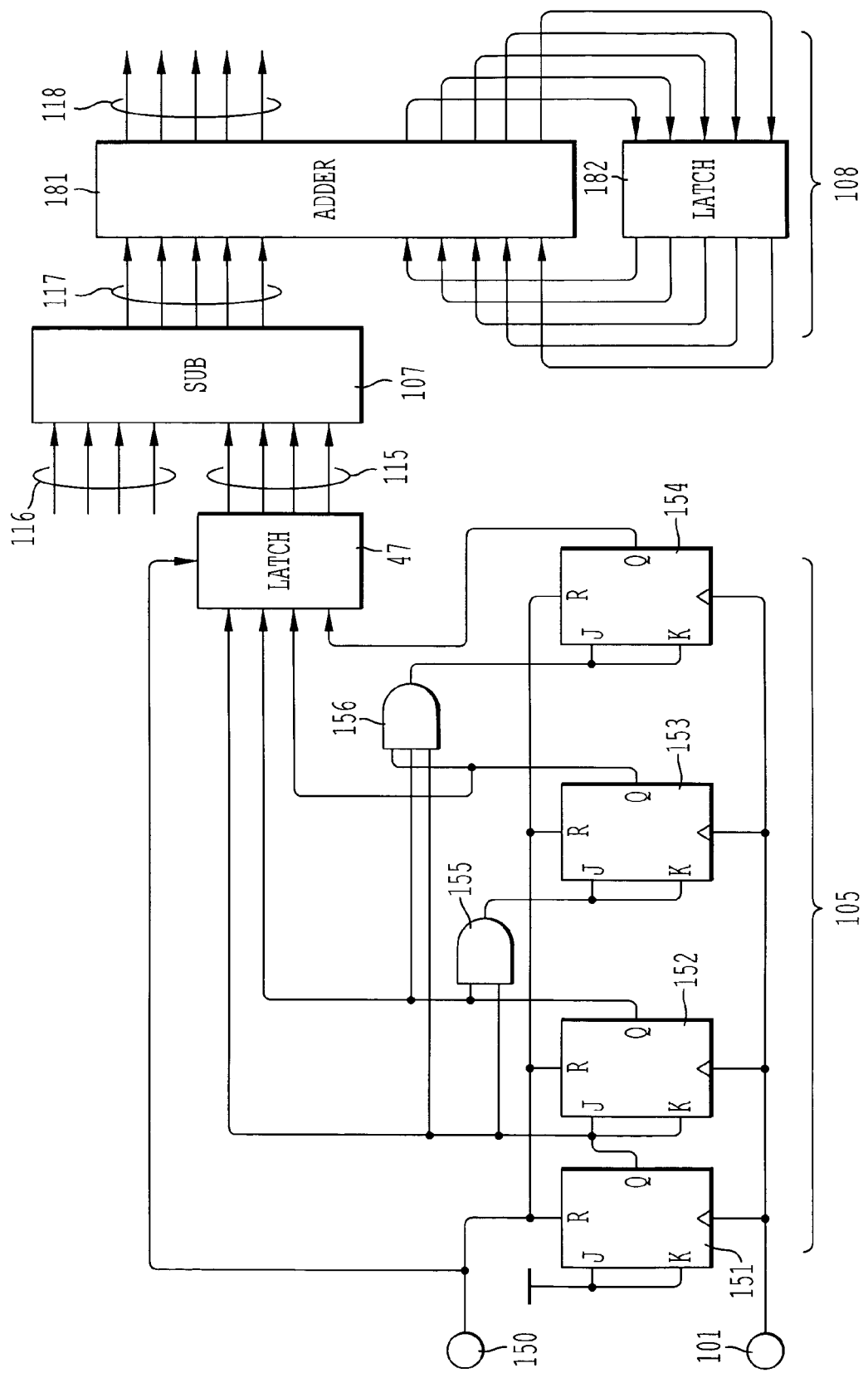
FIG. 8 is a circuit diagram of the counter, the adder and an integrator in FIG. 7.

FIG. 8 is a circuit diagram of the counter 105, the subtractor 107, and the integrator 108. The counter 105 and the subtractor 107 are the same as in the second embodiment in FIG. 6. The integrator 108 consists of an adder 181 and a latch 182. The adder 181 adds the output value 117 from the subtractor 107 to the previous output value of the adder 181 preserved in the latch 182 and outputs an integrated value of the output digital value 117 from the subtractor 107 as an output digital value 118.

In this way, in the third embodiment, the error between the set value "m" of desired ratio of frequency and actual ratio "f1/f2" of frequency of two input signals 111, 112 is integrated. In short, a phase difference between a multiplication signal of frequency "m×f1" and the second input signal of frequency "f2" is calculated. Accordingly, even if the actual ratio "f1/f2" of the frequencies of the first input signal 111 and the second input signal 112 is any value, the phase difference between two input signals is detected.

Figure 9:
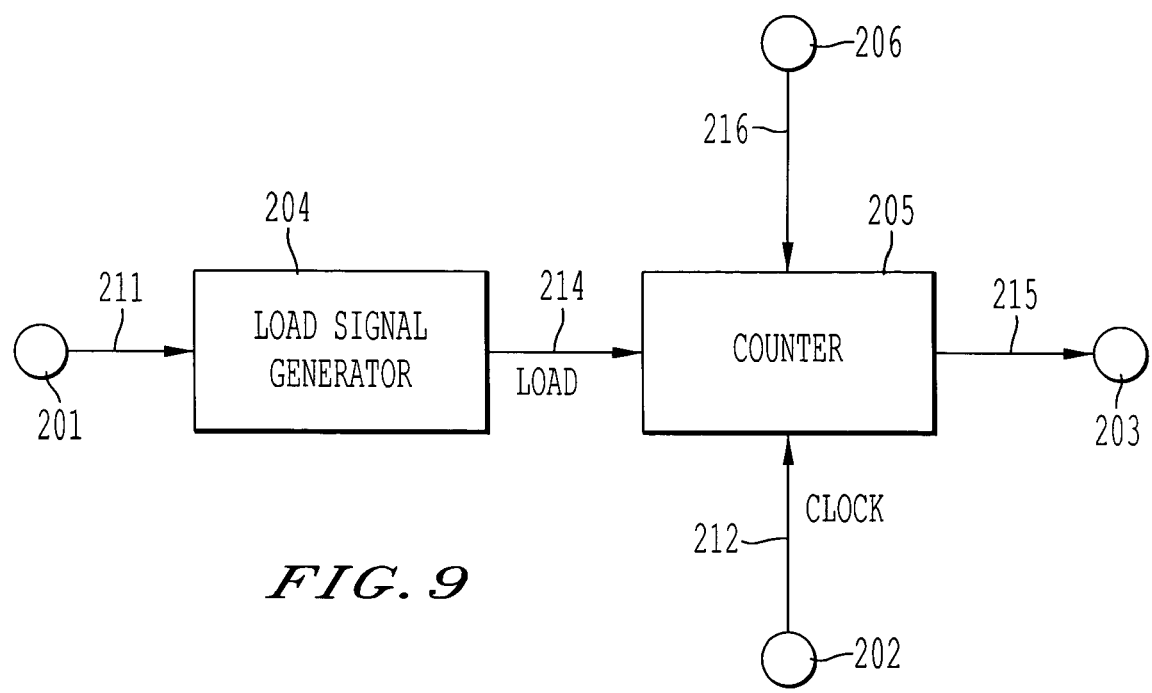
FIG. 9 is a block diagram of the comparator according to a fourth embodiment of the present invention.

FIG. 9 is a block diagram of the comparator according to a fourth embodiment of the present invention. This comparator inputs a binary first signal 211 from the first input terminal 201 and a binary second signal 212 from the second input terminal 202 and outputs a digital value 215 representing a phase difference between the first input signal 211 and the second input signal 212 to an output terminal 203. This comparator consists of a load signal generator 204 and a counter 205. For example, the load signal generator 204 is a differentiator and generates a load signal 214 at each timing of a rising edge, a falling edge, or both edges of the first input signal 211. The load signal 214 is input to a load terminal of the counter 205. The second input signal 212 is input to a clock terminal of the counter 205. Furthermore, a set value 216 of the ratio of frequencies is input to the third input terminal 206 of the counter 205. The set value of the ratio of frequency represents a digital value of desired ratio of frequency of the first input signal 211 and the second input signal 212. The counter 205 counts the second input signal 212 at each timing of input of the load signal, generates the counted value representing the ratio of frequency of the first input signal 211 and the second input signal 212, calculates the error between the counted value and the set value 216 of ratio of frequency of the two input signals, and outputs an integrated value of the error as a digital value 215. This digital value 215 is output from an output terminal 203.

Figure 10:
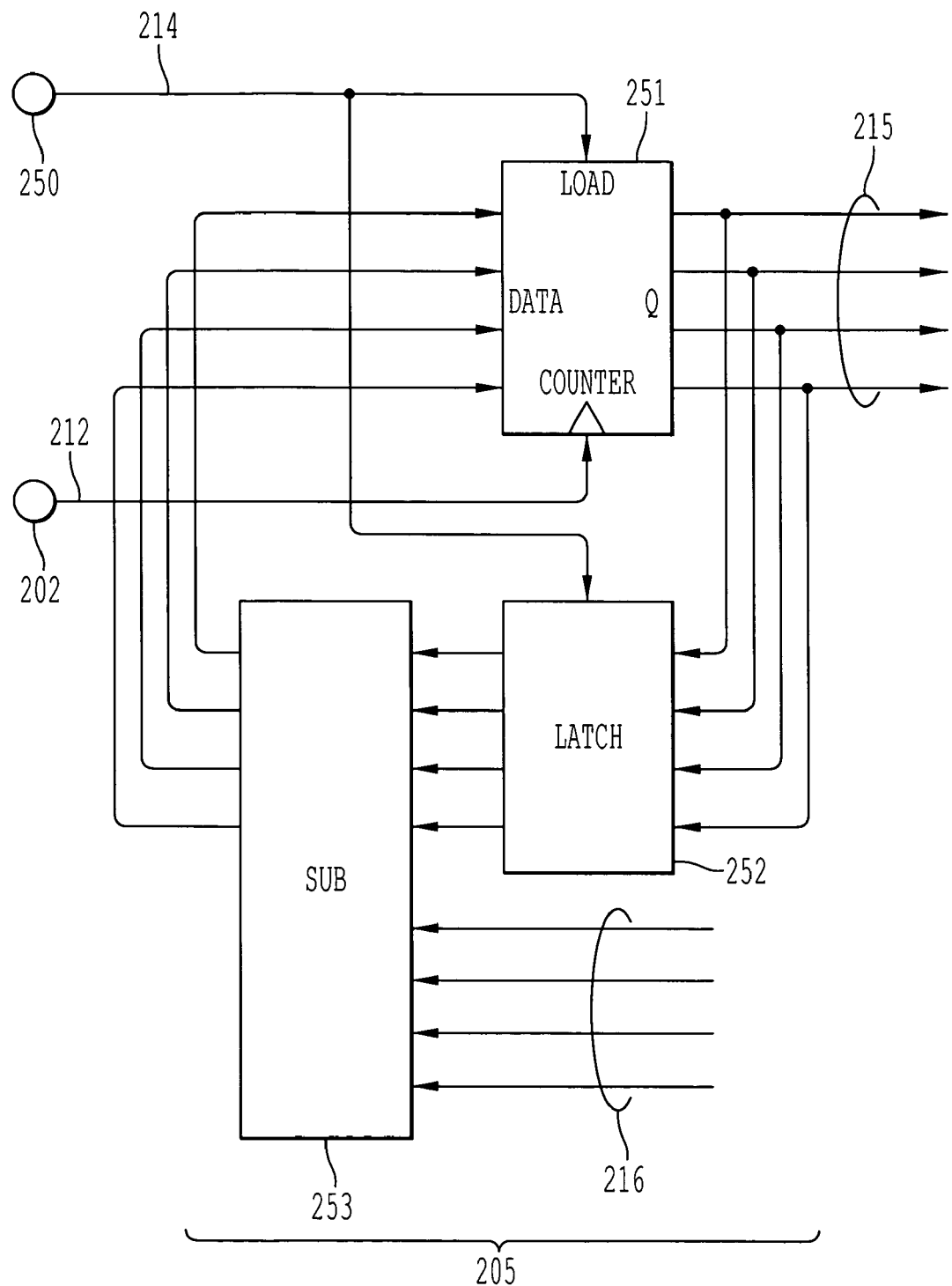
FIG. 10 is a circuit diagram of the counter in FIG. 9.

FIG. 10 is a circuit diagram of the counter 205 according to the fourth embodiment. This counter 205 is consists of a counter circuit 251, a latch 252, and a subtractor 253. The load signal 214 is input to a load terminal of the counter circuit 251, and the second input signal 212 is input to a clock terminal of the counter circuit 251. The output digital value 215 from the counter circuit 251 is guided to the output terminal 203 and preserved by the latch 252 at the timing of load signal 214. The output digital value from the latch 252 and the set value 216 of ratio of frequency are input to the subtractor 253. The subtractor 253 calculates the error between the output digital value and the set value. This error is loaded to the counter circuit 251 at the timing of load signal 214. Concretely, when the load signal 214 is generated at a timing of each rising edge of the first input signal 211 and the output from the subtractor 253 is loaded to the counter circuit 251 at an input timing of the load signal 214, the counter circuit 251 starts counting the second input signal 212. In short, a digital value representing a number of periods of the second input signal 212 in one period of the first input signal 211, i. e., a ratio of frequency of the first input signal 211 and the second input signal 212, is determined. This digital value is latched by the latch 252 at the timing of the load signal 214. The counting operation immediately restarts after loading by the load signal 214. Accordingly, if the ratio of frequencies of the first input signal 211 and the second input signal 212 is not an integer, DC value preserved in the latch 252 correctly represents the ratio of frequencies based on the principle explained in FIG. 2. Then, an error between the ratio of frequencies preserved in the latch 252 and the set value 216 is calculated by the subtractor 253 and loaded to the counter circuit 251 at timing of the load signal 214 again. This operation is repeated. As a result, the counter circuit 251 outputs a digital value 215 as an integrated value of error between the ratio of frequencies of two input signals 211 and 212 and the set value 216.

As mentioned-above, in the fourth embodiment, the counter 205 integrates the error between actual ratio "f1/f2" of frequency of the two input signals 211, 212 and the set value "m" of desired ratio of frequency. In short, a phase difference between a signal of frequency "m×f1" and a signal of frequency "f2" is calculated. In other words, even if the ratio "f1/f2" of frequencies of the first input signal 211 and the second input signal 212 is any value, the phase difference of two input signals 211 and 212 is detected. Especially, in the fourth embodiment, in the inside of the counter 205, the error between the actural ratio "f1/f2" of two input signals 211 and 212 and the set value "m" of desired ratio is detected and integrated. Accordingly, the integrator as another unit in the third embodiment is not necessary and a component of the circuit becomes simple.

Furthermore, in the fourth embodiment, the load signal generator 204 is not always necessary. If the counter 205 is loaded by an edge of each rising edge or each falling edge of the first input signal 211, the load signal generator 204 is omitted.

Figure 11:
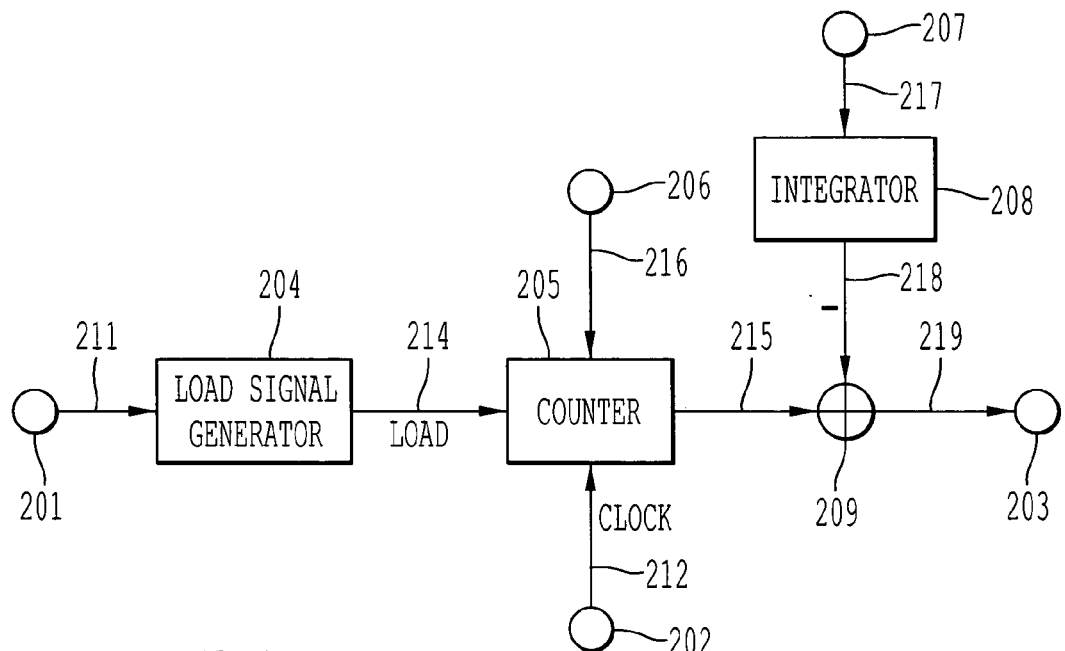
FIG. 11 is a block diagram of the comparator according to a fifth embodiment of the present invention.

FIG. 11 is a block diagram of the comparator according to a fifth embodiment of the present invention. In addition to the component of the fourth embodiment in FIG. 7, the fourth input terminal 207, the integrator 208, and the subtractor 209 are added. In the fifth embodiment, as the set value of ratio of frequencies of two input signals 211 and 212, non-integer value, i. e., a value including a decimal is used. In this case, an integer part 216 of the set value is input to the third input terminal 206, and a decimal part 217 of the set value is input to the fourth input terminal 207. Accordingly, the counter 205 integrates the error between actual ratio of frequency of two input signals 211, 212 and the integer part 216 of the set value. A digital value 215 as an integrated value of the error is output from the counter 205.

On the other hand, the decimal part 217 of the set value is integrated by the integrator 208. The output digital value 218 from the integrator 208 is subtracted from the output digital value 215 by the subtractor 209. As a result, a digital value 219 representing the phase difference between two input signals 211 and 212 is output to the output terminal 203.

In this way, in the fifth embodiment, in case of detecting the phase difference by integrating the error between the actual ratio of frequencies of two input signals and the set value, integration of the error between the actual ratio of frequencies and the integer part of the set value is executed by the counter 205, and integration of the error between the actual ratio of frequencies and the decimal part of the set value is executed outside of the counter 205. As a result, the phase difference is detected with high precision.

In principle, non-integer value as the set value 216 of the desired ratio of frequency is supplied to the comparator of the fourth embodiment shown in FIG. 9. However, in this case, the component of the counter 205 becomes complicated, different from the component of FIG. 10. On the other hand, in the fifth embodiment, the component of the counter 205 is not so complicated, and the error between the actual ratio of the frequencies of two input signals 211 and 212 and the set value of non-integer is integrated by simple component. As a result, the phase difference is detected with high precision.

Figure 12:
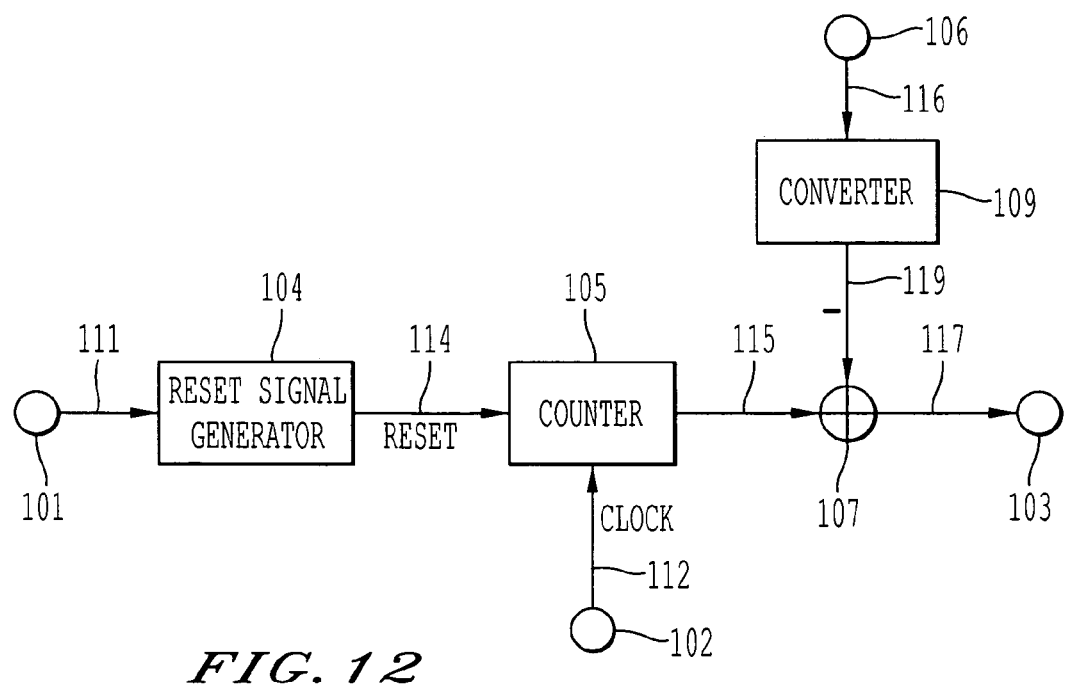
FIG. 12 is a block diagram of the comparator according to a sixth embodiment of the present invention.

FIG. 12 is a block diagram of the comparator according to a sixth embodiment of the present invention. In addition to the component of the second embodiment in FIG. 5, a converter 109 is inserted between the third input terminal 106 and the subtractor 107. The set value 106 of non-integer (including a decimal) is input to the third input terminal 106. The converter 109 converts the set value 106 to a series of digital value (a series of integer values) 119 whose average value is the set value. In short, an integer part and next integer in the set value are repeatedly arranged by a ratio of the decimal part in the set value. For example, if the set value 116 is "2.5", the series of integers 119 output from the converter 109 is as follows.

2, 3, 2, 3, 2, 3, . . .

If the set value 116 is "5.1", the series of integers 119 is as follows.

5, 5, 5, 5, 5, 5, 5, 5, 5, 6, 5, 5, 5, 5, 5, 5, 5, 5, 5, 6, 5, 5, . . .

On the other hand, if actual ratio of frequency of the first input signal 111 and the second input signal 112 is " 1:5.1", the output digital value 115 from the counter 105 is as follows.

5, 5, 5, 5, 5, 5, 5, 5, 5, 6, 5, 5, 5, 5, 5, 5, 5, 5, 5, 6, 5, 5, . . .

In this case, if the set value 116 is "5.1", the output digital vlaue 117 from the subtractor 107 is as follows.

0, 0, 0, 0, 0, 0, 0, 0, 0, 0, 0, 0, 0, 0, 0, 0, 0, 0, 0, 0, 0,

In short, if the actual ratio of frequencies of the first input signal 111 and the second input signal 112 coincides with the set value 116, "0" is always output.

In the prior art, in case of the set value of non-integer, a repeat pattern is generated in the output even if the actual ratio of the frequencies of two input signals coincides with the set value. As a result, the output includes noise. However, in the sixth embodiment, the repeat pattern is not generated and such a problem is solved.

Next, if the set value 116 is "5.1" and the actual ratio of frequency of two input signals 111 and 112 is slightly larger than "1:5.1", the output digital value 115 from the counter 105 is, for example, as follows.

5, 5, 5, 5, 5, 5, 5, 5, 6, 5, 5, 5, 5, 5, 5, 5, 5, 6, 5, 5, 5, . . .

In this case, the output digital value 117 from the subtractor 107 is as follows.

0, 0, 0, 0, 0, 0, 0, 0, 1, −1, 0, 0, 0, 0, 0, 0, 0, 1, 0, −1, 0, 0, 0, 0, 0, 1, 0, 0, −1, . . .

As a result, an error between the actual ratio of the frequencies of two input signals 111 and 112 and the set value 116 is detected.

Next, the case that the error between the actual ratio of the frequencies of two input signals 111, 112 and the set value 116 becomes large is explained. For example, assume that the output digital value from the counter 105 is as follows, 5, 5, 5, 6, 5, 5, 5, 6, 5, 5, 5, 6, 5, 5, 5, 6, 5, 5, 5, 6, . . .

In this case, the output digital value 117 from the subtractor 107 is as follows.

0, 0, 0, 1, 0, 0, 0, 1, 0, −1, 0, 1, 0, 0, 0, 1, 0, 0, 0, 0, 0, 1, 0, 0, 0, 1, . . .

Therefore, in this case, the error between the actual ratio of the frequencies of two input signals 111 and 112 and the set value 116 is detected. In this way, in the sixth embodiment, the error between the actual ratio of the frequencies and the set value is detected with high precision without repeat pattern.

Figure 13:
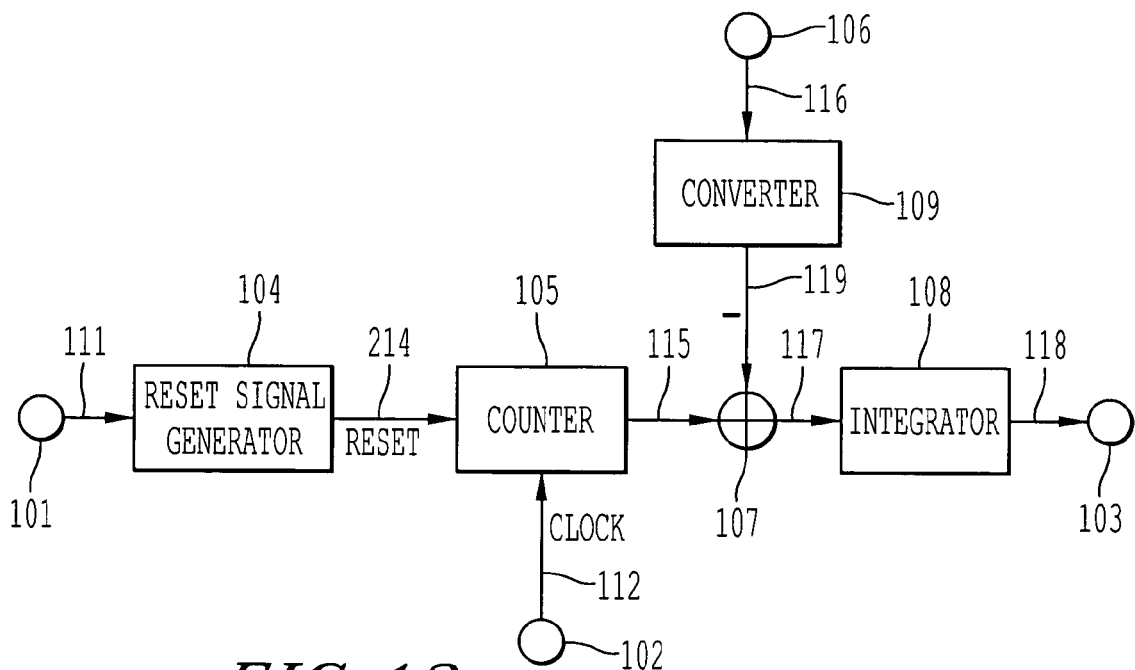
FIG. 13 is a block diagram of the comparator according to a seventh embodiment of the present invention.

FIG. 13 is a block diagram of the comparator according to a seventh embodiment of the present invention. In addition to the component of the sixth embodiment in FIG. 12, an integrator 108 is inserted after the subtractor 107. As mentioned-above in the third embodiment, the subtractor 107 outputs the error between the actual ratio of the frequencies of two input signals 111 and 112 and the set value 116. Accordingly, the integrator 108 integrates the error and the phase difference between the first input signal 111 and the second input signal 112 in frequency based on the set value 116 is detected.

In order to concretely explain, assume that the frequency of the first input signal 111 is "f1", the frequency of the second input signal 112 is "f2", and the set value 116 of desired ratio of frequency is "m". The integrator 108 outputs a digital value 118 representing a phase difference between a signal of frequency "m×f1" (m times of frequency of the first input signal 111) and the second input signal of frequency "f2". In this case, "m" is not limited to an integer and may be a decimal (non-integer). Accordingly, in the seventh embodiment, even if the actual ratio "f1/f2" of the frequencies of two input signals 111 and 112 is any value, the phase difference between the two input signals is correctly detected.

Figure 14:
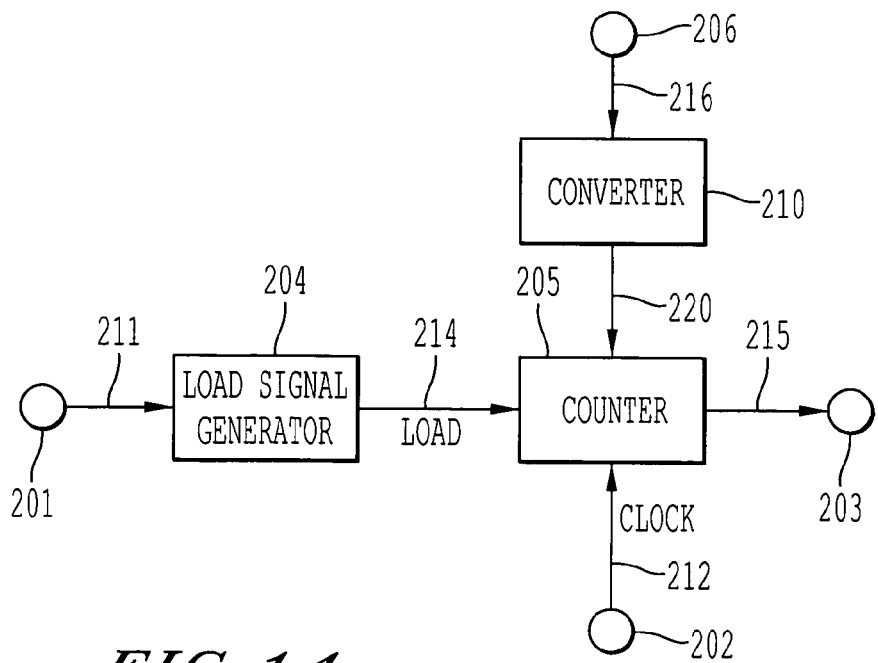
FIG. 14 is a block diagram of the comparator according to an eighth embodiment of the present invention.

FIG. 14 is a block diagram of the comparator according to an eighth embodiment of the present invention. In addition to the component of the fourth embodiment in FIG. 9, the converter 210 is inserted between the third input terminal 206 and the counter 205. The set value 216 of non-integer (including a decimal) is input to the third input terminal 206. The converter 210 converts the set value 216 to a series of digital values 220 (a series of integer values) whose average value is the set value 216. The series of integer values are output to the counter 205.

As explained in the fourth embodiment, the counter 205 counts the second input signal 212 at an input timing of the load signal 214, generates the counted value representing the actual ratio of the frequencies of the first input signal 211 and the second input signal 212, calculates an error between the counted value and a set value of desired ratio of frequencies, integrates the error, and outputs the integrated value as a digital value 215. The digital value from the counter 205 is output from the output terminal 203.

In this way, in the eighth embodiment, the counter 205 integrates the error between the actual ratio "f1/f2" of the frequencies of the two input signals 211 and 212 and the set value "m" of desired ratio of frequency. In short, a phase difference between a signal of frequency "m×f1" and a signal of frequency "f2" is calculated. Furthermore, "m" is not limited to an integer and may be a non-integer including a decimal. Accordingly, even if the ratio "f1/f2" of the frequencies of the first input signal 211 and the second input signal 212 is any value, the phase difference of two input signals 211 and 212 is detected. Especially, in the eighth embodiment, in the inside of the counter 205, the error between the actural ratio "f1/f2" of the two input signals 211 and 212 and the set value "m" of desired ratio is detected and integrated. Accordingly, the integrator as another unit in the seventh embodiment is not necessary and a component of the circuit becomes simple.

Figure 15A:
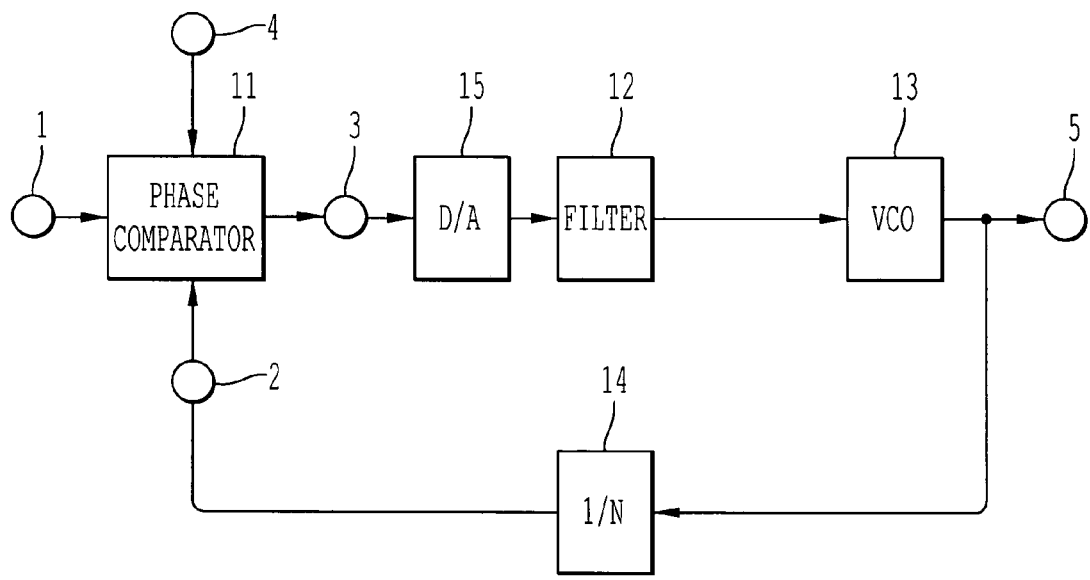
FIGS. 15A and 15B are block diagrams of PLL circuit in which the comparator of the present invention is used as a phase comparator.
Figure 15B:
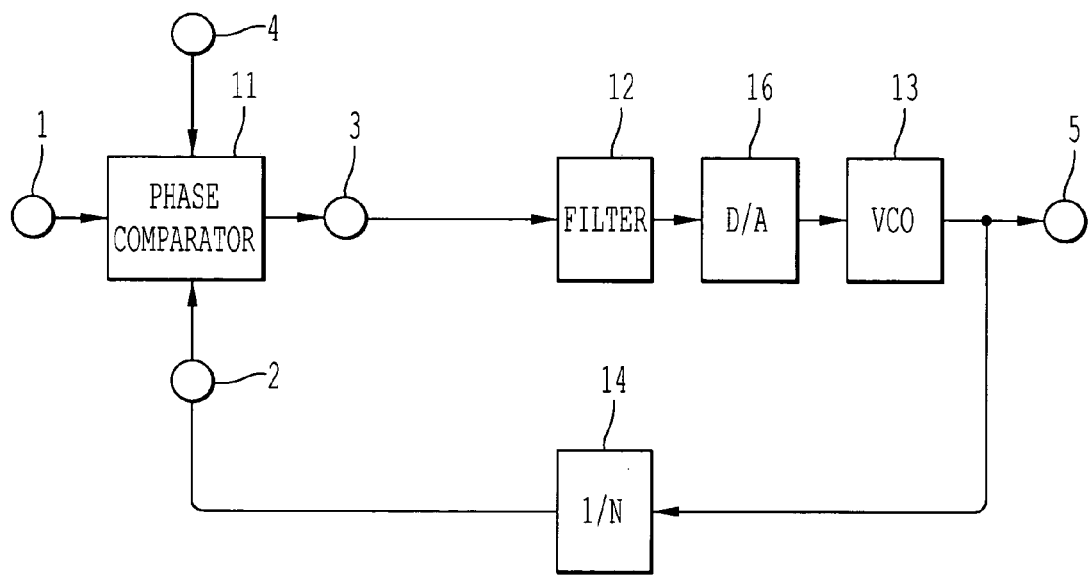

FIGS. 15A and 15B are block diagrams of a PLL circuit in which the comparator of the present invention is used as a phase comparator. This PLL circuit includes of the phase comparator 11, a filter 12, a voltage control oscillator (VCO) 13 as a variable frequency oscillator, and a divider 14. The phase comparator 11 includes a function to detect a phase difference, i. e., any comparator shown in FIGS. 7, 9, 11, 13, 14. A reference signal from a reference oscillator (not shown in FIGS. 15A and 15B) is input to the first input terminal 1 as the first input signal. An output signal from the divider 14 is input to the second input terminal 2 as the second input signal. The set value of desired ratio of frequencies is input to the third input terminal 4. The phase comparator 11 outputs the integrated value of the error between the actual ratio of frequencies of the two input signals and the set value of desired ratio, i. e., a phase difference signal between the two input signals. After the filter 12 (for example, a low-pass filter) eliminates unnecessary elements from the phase difference signal, this output signal is input to VCO 13 as a control signal. The oscillation frequency of VCO 13 is controlled by the output signal of the filter 12. An output from VCO 13 is supplied from the output terminal 5 to the outside. In addition to this, after the output from VCO 13 is divided by the divider 14, this divided signal is input to the phase comparator 11 as the second input signal.

The phase comparator 11 based on the present invention outputs a digital value. If the filter 12 is a digital filter, output from the phase comparator 11 is input to the filter 12 as it is. However, in case of using an analog filter, the output from the phase comparator 11 is converted to analog signal by D/A converter 15, and input to the filter 12 as shown in FIG. 15A. Furthermore, if the filter 12 is a digital filter and VCO 13 is an analog VCO, i. e., the variable frequency oscillator whose oscillation frequency is controlled by analog control voltage, the output from the filter 12 is converted to analog signal by D/A converter 16, and input to VCO 13 as shown in FIG. 15B. If the filter 12 is a digital filter and VCO 13 is a digital VCO, i. e., a numeric control oscillator whose oscillation frequency is controlled by digital control signal, the output signal from the filter 12 is directly input to VCO 13. Furthermore, if the filter 12 includes an integration function, the comparator shown in FIG. 5, 12 is used as the phase comparator 11.

In this PLL circuit, the oscillation frequency from VCO 13 is controlled so that the phase difference of two input signals detected by the phase detector 11 is "0". As mentioned-above, in the comparator of the present invention, a phase difference of two input signals is detected even if frequencies of the two input signals are different. Accordingly, it is not necessary that a frequency of reference signal (the first input signal) is equal to a frequency of output signal (the second input signal) from the divider 14. In comparison with the PLL circuit of the prior art, free degree of design greatly increases.

Assume that the frequency of the reference signal as the first input signal is f1, the set value of desired ratio of frequency is M, a ratio of division of the divider 14 is N. In this case, frequency "f out" of output signal from the output terminal 5, i. e., the oscillation frequency of VCO 13, is represented as follows.

$$f\text{ out}=M \cdot N * f1$$

On the other hand, frequency of output signal from PLL circuit of the prior art is represented as follows.

$$f\text{ out}=N * f1$$

In a normal divider, the ratio N of division is integer. In PLL circuit of the prior art, frequency of the output signal must be selected as a multiple of integer of frequency f1 of the reference signal. Accordingly, if an interval of frequency of generatable output signal is narrowed by changing the ratio N of division, it is necessary that the frequency of the reference signal is set below the interval of frequency of the generatable output signal. However, in case that low frequency of the reference signal is used in PLL circuit, characteristics of transition response at change timing of frequency goes down.

On the other hand, if the comparator of the present invention is used as the phase comparator 11, the set value M of desired ratio of frequency is selected as non-integer value. Accordingly, the frequency of the output signal is freely set and the interval of frequency of generatable output signal is easily narrowed.

Furthermore, the ratio of division of non-integer is used in the divider 14. However, such a divider is complicated in component and expensive. In addition to this, the interval of output pulse from the divider changes irregularly and the output signal from PLL circuit is badly affected. On the other hand, if the comparator of the present invention is used as the phase comparator 11, the ratio of division of integer is sufficiently used in the divider 14. As a result, above-mentioned problem is not accurred.

Furthermore, the frequency of the output signal is freely changed by the set value M of the ratio of frequency only. Accordingly, the divider 14 may be omitted in PLL circuit. In this case, the cost of PLL circuit is further reduced.

As mentioned-above, in the present invention, by a digital circuit in which the counter is main body as simple component, actual ratio of frequency of two input signals whose frequencies are different is detected, an error between the actual ratio and a set value is detected, and a phase difference between the two input signals is detected.

In the phase comparator of the prior art, the phase difference between two input signals whose frequencies are different is not detected. Especially, in component of PLL circuit, it is necessary that frequencies of two input signals to the phase comparator is equal. As a result, free degree of component of PLL circuit is greatly narrowed, and free degree of output frequency of PLL circuit is low. However, if the comparator of the present invention is used as the phase comparator of PLL circuit, such limitation is not necessary and free degree of design of PLL circuit greatly improves.

Furthermore, in the phase comparator of the prior art applicable to the case that the phase difference of two input signals is over a range "$-2\pi \sim 2\pi$" and frequencies of the two input signals are different, complicated analog circuit element is necessary, and the circuit becomes large in scale and expensive. However, the comparator of the present invention is a digital circuit in which the counter is main body, i. e., simple circuit component. As a result, this comparator of high ability is realized by low cost.

Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

What is claimed is:

1. A PLL circuit including a phase comparator to control an output signal of a variable frequency oscillator, a reference signal of a predetermined frequency is a first input signal, and one of an output signal and a divided signal of the output signal from the variable frequency oscillator is a second input signal, wherein the phase comparator for comparing the first input signal and the second input signal, comprising:

a generator configured to generate a reset signal at each rising edge or each falling edge of the first input signal;

a counter configured to count the second input signal at each interval determined by the reset signal, a counted value represents a ratio of frequencies of the first input signal and the second input signal; and a subtractor configured to calculate a difference between the counted value and a set value representing a predetermined ratio of the frequencies of the first input signal and the second input signal.

2. The PLL circuit according to claim 1, further comprising:

an integrator configured to integrate the difference outputted from said subtractor, the integrated value represents a phase difference of the frequencies of the first input signal and the second input signal.

3. A PLL circuit including a phase comparator to control an output signal of a variable frequency oscillator, a reference signal of a predetermined frequency is a first input signal, and one of an output signal and a divided signal of the output signal from the variable frequency oscillator is a second input signal, wherein the phase comparator for comparing the first input signal and the second input signal, comprising:
a generator configured to generate a load signal at each rising edge or each falling edge of the first input signal; and
a counter configured to count the second input signal at each interval determined by the load signal, to calculate a difference between a counted value and a set value representing a predetermined ratio of frequencies of the first input signal and the second input signal, and to integrate the difference, an integrated value represents a phase difference of the frequencies of the first input signal and the second input signal.

4. A PLL circuit including a phase comparator to control an output signal of a variable frequency oscillator, a reference signal of a predetermined frequency is a first input signal, and one of an output signal and a divided signal of the output signal from the variable frequency oscillator is a second input signal, wherein the phase comparator for comparing the first input signal and the second input signal, comprising:
a counter configured to count the second input signal at each rising edge or each falling edge of the first input signal, to calculate a difference between a counted value and a set value of an integer part of a predetermined ratio of frequencies of the first input signal and the second input signal, and to integrate the difference as a digital value;
an integrator configured to integrate a set value of a decimal part of the predetermined ratio of frequencies of the first input signal and the second input signal; and
a subtractor configured to calculate a difference between the digital value from said counter and an integrated value from said integrator, the difference represents a phase difference of the frequencies of the first input signal and the second input signal.

5. A PLL circuit including a phase comparator to control an output signal of a variable frequency oscillator, a reference signal of a predetermined frequency is a first input signal, and one of an output signal and a divided signal of the output signal from the variable frequency oscillator is a second input signal, wherein the phase comparator for comparing the first input signal and the second input signal, comprising:
a counter configured to count the second input signal at each rising edge or each falling edge of the first input signal, and to output a counted value as a digital value representing a ratio of frequencies of the first input signal and the second input signal;
a converter configured to convert a non-integer digital set value as a predetermined ratio of the frequencies of the first input signal and the second input signal to a sequence of integer digital values whose average value coincides with the digital set value; and
a subtractor configured to calculate a difference between the counted value output from said counter and the integer digital values output from said converter.

6. The PLL circuit according to claim 5, wherein the non-integer digital set value is comprised of an integer part and a decimal part representing the predetermined ratio of each frequency of the first input signal and the second input signal.

7. The PLL circuit according to claim 6,
wherein the sequence of integer digital values is comprised of the integer part and a next integer repeatedly arranged by a ratio of the decimal part in the digital set value of non-integer.

8. The PLL circuit according to claim 7,
wherein said subtractor correspondingly subtracts each integer in the sequence of digital values from each integer in the counted value.

9. The PLL circuit according to claim 5, further comprising:
an integrator configured to integrate the difference calculated by said subtractor, the integrated value represents a phase difference of the first input signal and the second input signal.

10. The PLL circuit according to claim 9,
wherein the integrated value represents the phase difference between the first input signal and the second input signal in frequency based on the digital set value.

11. A PLL circuit including a phase comparator to control an output signal of a variable frequency oscillator, a reference signal of a predetermined frequency is a first input signal, and one of an output signal and a divided signal of the output signal from the variable frequency oscillator is a second input signal, wherein the phase comparator for comparing the first input signal and the second input signal, comprising:
a converter configured to convert a non-integer digital set value as a predetermined ratio of frequencies of the first input signal and the second input signal to a sequence of integer digital values whose average value coincides with the digital set value; and
a counter configured to count the second input signal at each rising edge or each falling edge of the first input signal, to calculate a difference between a counted value and the integer digital values, and to integrate the difference, an integrated value represents a phase difference of the first input signal and the second input signal.

12. The PLL circuit according to claim 11,
wherein the integrated value represents the phase difference between the first input signal and the second input signal in frequency based on the digital set value.

* * * * *